(12) United States Patent
Mathieu (10) Patent No.: US 11,412,620 B2
(45) Date of Patent: Aug. 9, 2022

(54) PROCESS FOR MANUFACTURING A ROLL OF FLEXIBLE CARRIER FOR ELECTRONIC COMPONENTS

(71) Applicant: Linxens Holding, Mantes la Jolie (FR)

(72) Inventor: Christophe Mathieu, Mantes la Jolie (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 16/973,529

(22) PCT Filed: Jun. 12, 2019

(86) PCT No.: PCT/FR2019/051413
§ 371 (c)(1),
(2) Date: Dec. 9, 2020

(87) PCT Pub. No.: WO2019/239061
PCT Pub. Date: Dec. 19, 2019

(65) Prior Publication Data
US 2021/0251084 A1      Aug. 12, 2021

(30) Foreign Application Priority Data

Jun. 15, 2018 (FR) ...................................... 1870711

(51) Int. Cl.
*H05K 3/32* (2006.01)
(52) U.S. Cl.
CPC ............. *H05K 3/326* (2013.01); *H05K 3/323* (2013.01); *H05K 2201/10984* (2013.01)

(58) Field of Classification Search
CPC ........ H05K 3/326; H05K 3/323; H05K 3/321; H05K 2201/10984; H05K 13/021;
(Continued)

(56) References Cited

U.S. PATENT DOCUMENTS

| 4,829,663 A | 5/1989 | Masujima et al. ............... 29/840 |
| 6,446,874 B1 * | 9/2002 | Elbaz ................ G06K 19/07718 235/489 |
| 7,154,758 B2 * | 12/2006 | Welling ............... G06K 19/077 29/842 |

FOREIGN PATENT DOCUMENTS

| FR | 2 613 175 | 9/1988 |
| WO | WO 00/25265 | 5/2000 |

(Continued)

*Primary Examiner* — Donghai D Nguyen
(74) *Attorney, Agent, or Firm* — Harrington & Smith (57) ABSTRACT

The invention relates to a process for manufacturing a roll of flexible carrier bearing electronic components. This process includes a step consisting in adding, to this flexible carrier, electronic components, themselves manufactured from a roll of flexible initial substrate. For example, the electronic components may be manufactured on an initial substrate having a width allowing advantage to be taken of densification of the manufacture of the components on this initial substrate. Subsequently, the singulated electronic components are added to the flexible carrier, allowing, for example, packaging that is more suitable, than possible with the initial substrate, to a use of the electronic components, notably when the latter must be integrated into a chip-card. Thus, for example, the flexible carrier may be, or include, an adhesive, which may or may not be conductive, and which is used to fasten, and optionally connect, each electronic component to a chip-card.

19 Claims, 4 Drawing Sheets

(58) Field of Classification Search
CPC ............ G06K 19/07754; G06K 19/077; Y10T 29/4913; Y10T 29/49147
USPC .................................................. 29/832, 842
See application file for complete search history.

(56) References Cited

FOREIGN PATENT DOCUMENTS

WO     WO 2017/168100 A1    10/2017
WO     WO 2017/191414 A1    11/2017

* cited by examiner

PROCESS FOR MANUFACTURING A ROLL OF FLEXIBLE CARRIER FOR ELECTRONIC COMPONENTS

CROSS REFERENCE TO RELATED APPLICATION

This patent application is a U.S. National Stage application of International Patent Application Number PCT/FR2019/051413 filed Jun. 12, 2019, which is hereby incorporated by reference in its entirety, and claims priority to FR 1870711 Jun. 15, 2018.

BACKGROUND OF THE INVENTION

The invention relates to the field of manufacture of electronic components to be integrated into and connected to chip-cards.

BRIEF SUMMARY OF THE INVENTION

The electronic components to which the invention relates may be modules for chip-cards (bank cards, transportation payment cards, identity cards, SIM cards (SIM being the acronym of Subscriber Identification Module), etc.). These chip-card modules may be:
  modules with contacts for reading or writing information contained in one or more chips or memories integrated into the module itself or into the card into which the module is incorporated, such modules possibly for example corresponding to standard ISO 7810,
  devices for measuring biometrics (fingerprint reader for example),
  displays of card verification values (CVVs),
  components for communicating over distance (Bluetooth components for example),
  etc.

These components or electronic modules must be reliably fastened to a cavity in the card that receives them, and optionally connected to an antenna and/or a flexible printed circuit connecting electronic and integrated components into the body of the card, for example between constituent layers thereof. These components may be transferred from one carrier to another using chip-transferring techniques. An example of the technique of this type is for example described in document FR2613175A1.

The invention aims to improve processes for manufacturing electronic components of this type and, potentially, their integration into cards and notably chip-cards.

This aim is at least partially achieved using a process for manufacturing a roll of carrier for electronic components, wherein
  a roll of flexible carrier is provided, which is unrolled,
  at least one electronic component is provided,
  at least one electronic component is placed on an unrolled portion of the flexible carrier.

Furthermore, the flexible carrier comprises an adhesive material suitable for receiving and fastening an electronic component before this electronic component is added to a chip-card.

Specifically, by virtue of the process according to the invention, the electronic components may be manufactured, finalized and regularly arranged on a carrier strip. Specifically, this carrier strip is used as a temporary holder of the electronic components and at the same time as an adhesive material certain regions or segments of which may optionally be added (transferred) to each electronic component. Thus, the flexible carrier may play a dual role:
  on the one hand, that of receiving, in a rolled carrier, the, advantageously finalized, electronic components, with a view to a subsequent use whereby they will be integrated into a chip-card; and
  on the other hand, that of providing an adhesive material that may be used to fasten each singulated component to a chip-card. Furthermore, if this adhesive material also possesses properties that allow it to conduct electricity in the direction corresponding to its thickness, it may be used to make an electrical connection between a component and a circuit or an antenna located in a card body.

Thus, the electronic components may be transferred directly from the carrier strip to a cavity in the body of the card.

In this document, the expression "adhesive material" designates both a material having adhesive properties at room temperature, such as notably a tacky adhesive, and a material that is made adhesive by heating, such as a hot-melt material. The conditions of use will be tailored to the properties thereof.

The carrier strip may comprise, in its width, a plurality of electronic components. Thus, the process according to the invention allows rolls bearing a very high number of electronic components to be produced, the electronic components placed on these rolls being finalized and ready to be integrated into cards. The carrier strips used for the manufacture of electronic components, and for example for the manufacture of modules meeting standard ISO 7810, comprise conveying holes on each of the longitudinal edges of the strip. Therefore, these carrier strips comprise two rows of conveying holes, but may comprise a variable number of rows of components. Thus, the higher the number of rows of components in the width of the carrier strips (between the two rows of conveying holes), the more readily the useful area of these carriers may be optimized. The density of electronic components per unit area of a carrier strip may be increased and the cost of manufacture per electronic component decreases accordingly. Alternatively, the electronic components may be produced on relatively wide flexible strips in order to optimize the number of electronic components produced per unit area, then the electronic components are added to a carrier strip of smaller width comprising an adhesive material, for example for reasons of compatibility with existing hardware.

The process according to the invention allows economies of scale to be achieved as it favors mass production of electronic components.

The process according to the invention furthermore comprises one of the following features, the latter being considered alone and independently of one another, or in combination with one or more others:
  at least one bonding pad is produced, in a bonding region of each provided electronic component, from the adhesive material;
  a multiplicity of apertures is produced with a regular arrangement in an unrolled portion of the flexible carrier;
  at least one electronic component having a top face and a bottom face and at least two different thicknesses measured between the top face and the bottom face is provided, at least one bonding region being located, on the bottom face, level with the first of these thicknesses, and at least one region of extra thickness being located, on the bottom face, level with the second of these thicknesses, the second thickness being larger than the first thickness;

each provided electronic component is placed in an aperture, by placing the region of extra thickness in one of the apertures;

at least one electronic component is added, with a segment of adhesive material on its bottom face, to the flexible carrier;

the flexible carrier is covered with a layer of bonding material on a main face that receives at least one electronic component;

the adhesive material is placed on a base strip to form the flexible carrier before the bonding region of the electronic component is placed above, directly in contact with the adhesive material;

the flexible carrier comprises a base strip, this base strip being cut so as to leave exposed at least one region of adhesive material, under an electronic component, then the adhesive material is cut in this region so as to detach the electronic component with a segment of adhesive material located in a bonding region before said component is added to a chip-card;

the adhesive material is laminated to a base strip, before apertures are produced through the flexible carrier formed from the base strip and from the adhesive material;

the adhesive material is a hot-melt film;

the adhesive material is a conductive anisotropic film that is electrically conductive through its thickness;

the flexible carrier comprises paper.

According to another aspect, the invention relates to a process for manufacturing a chip-card module, wherein, using the process described above, a roll of flexible carrier bearing electronic components is manufactured, each electronic component, borne by this flexible carrier and equipped with a segment of adhesive material in a bonding region, essentially forming a chip-card module.

According to yet another aspect, the invention relates to a process for manufacturing a chip-card wherein, using the process described above, a roll of flexible carrier bearing electronic components is produced, and at least certain of the electronic components borne by the flexible carrier are picked up with a view to placing them in a cavity in a chip-card.

Furthermore, according to this process for manufacturing a chip-card, each electronic component placed in a chip-card may be connected to a flexible printed circuit integrated into this chip-card.

According to yet another aspect, the invention relates to a roll of flexible carrier bearing electronic components, comprising:

a multiplicity of apertures cut, in a regular arrangement, through the thickness of the flexible carrier and electronic components having a top face and a bottom face, and at least two different thicknesses measured between the top face and the bottom face, at least one bonding region being located, on the bottom face, level with the first of these thicknesses, and a region of extra thickness being located, on the bottom face, level with the second of these thicknesses, this second thickness being larger than the first thickness, these electronic components being placed, each respectively, in one aperture, by placing the region of extra thickness into an aperture, each electronic component being placed on the flexible carrier with an adhesive material placed in a bonding region.

The roll of carrier according to the invention furthermore comprises one of the following features, the latter being considered alone and independently of one another, or in combination with one or more others:

the adhesive material is a hot-melt film;

the adhesive material is a conductive anisotropic film that is electrically conductive through its thickness.

According to yet another aspect, the invention relates to a chip-card module manufactured with a chip-card-module-manufacturing process such as described above, comprising a segment of adhesive material in a bonding region.

According to yet another aspect, the invention relates to a chip-card comprising at least one cavity in which a module such as mentioned above is fastened, by virtue of the segment of adhesive material present in a bonding region.

Other features and advantages of the invention will become apparent on reading the detailed description, which is accompanied by figures of a plurality of examples of modes of implementation of the invention.

DETAILED DESCRIPTION

The invention is exemplified below by way of a plurality of examples of implementation of the process for manufacturing a roll of carrier for electronic components.

Figure 1:
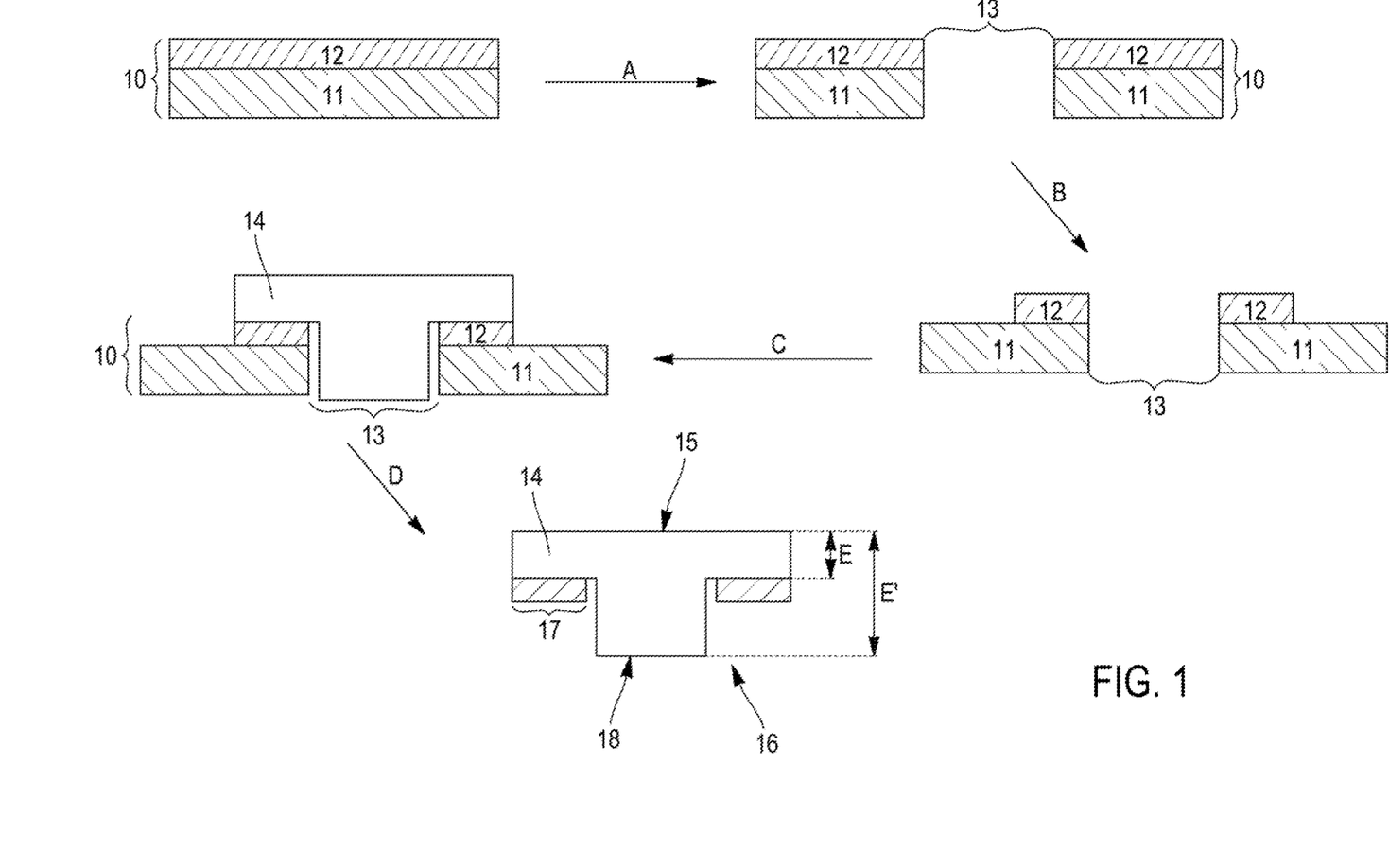
FIG. 1 schematically shows various steps of a first example of implementation of the process according to the invention.

According to a first example of implementation of the process according to the invention, said process comprises the following steps (FIG. 1):

providing and unrolling a segment of a roll of a complex material forming a flexible carrier 10 comprising a flexible base strip 11 with two main faces, one of these main faces being at least partially covered with an adhesive film 12; alternatively, according to one variant, the base strip 11 is provided in a roll, then unrolled and laminated with an adhesive film 12, to form a flexible carrier 10 that is used directly in the following perforating step;

perforating A the flexible carrier 10 resulting from the preceding step so as to create apertures 13 through both the base strip 11 and regions of adhesive film 12;

"«kiss cutting»" B the adhesive film 12 and delaminating the latter to leave at least one region of adhesive film 12 in the vicinity of each aperture 13;

placing C electronic components 14, each respectively in one aperture 13 produced in the perforating step A, and resting on the regions of adhesive film 12 left on the base strip 11 during the cutting B and associated delamination.

The base strip 11 is for example a paper liner of 90 to 100 microns thickness and 35 mm width in order to be compatible with the format of industrial equipment for manufacturing chip-cards. It is for example made of glassine (also called crystal paper) polyester (PET, PEN) or indeed polyimide.

The adhesive film 12 is for example an anisotropic conductive film that conducts electricity through its thickness. It for example has a thickness comprised between 40 and 50 μm and covers, for example completely, the paper.

The flexible carrier 10 with the adhesive film 12 is for example a product having the reference HAF® 8414 from the company Tesa® or EH8030-50 from the company Dexerials.

The «kiss cutting» B may be carried out using a laser or a rotar punch.

The electronic components 14 are placed on the flexible carrier 10, for example by pick and place from a plate. The electronic components 14 are fastened to the flexible carrier 10 for example by applying a pressure of 2 bars, at a temperature of 130° C., for 1 second.

The electronic components 14 may be modules according to ISO 7810 or feature modules such as devices for measuring biometrics, displays of card verification values, etc.

The electronic components 14 essentially have a top face 15 and a bottom face 16, and at least two different thicknesses E and E' measured between the top face 15 and the bottom face 16. At least one bonding region 17 is located, on the bottom face 16, level with the first E of these thicknesses. A region of extra thickness 18 is located, on the bottom face 16, level with the second E' of these thicknesses. The second thickness E' is larger than the first thickness E.

The fact that the electronic components 14 have a region of extra thickness 18 may result, for example, from the fact that the electronic chip and its electrical interconnects are encapsulated in a glob-top. In any case, the presence of apertures 13 allows the electronic components 14 to be better positioned and accommodated when the base strip 11 is rolled up, the thickness of the base strip 11 then allowing the thickness E' of the electronic components 14 to be at least partially compensated for.

Following this preparation and placement of the electronic components 14 on a roll of carrier for electronic components, which carrier is formed from the flexible carrier 10, the electronic components 14 may be picked up (for example by a pick-and-place machine 13 step D) from the flexible carrier 11, with their adhesive film 12 placed in the bonding regions 17, with a view to being integrated, in a known way, into a cavity in a card body.

The electronic components 14, which may be modules according to ISO 7810, may be produced on strips of large width (for example 70 or 150 millimeters in width) with a view to achieving a higher densification of the production of the electronic components 14. Optionally, for reasons of compatibility with existing hardware and tools, the electronic components 14 are transferred to flexible carriers 10 of small width (for example 35 millimeters in width) before being integrated into card bodies.

Figure 2:
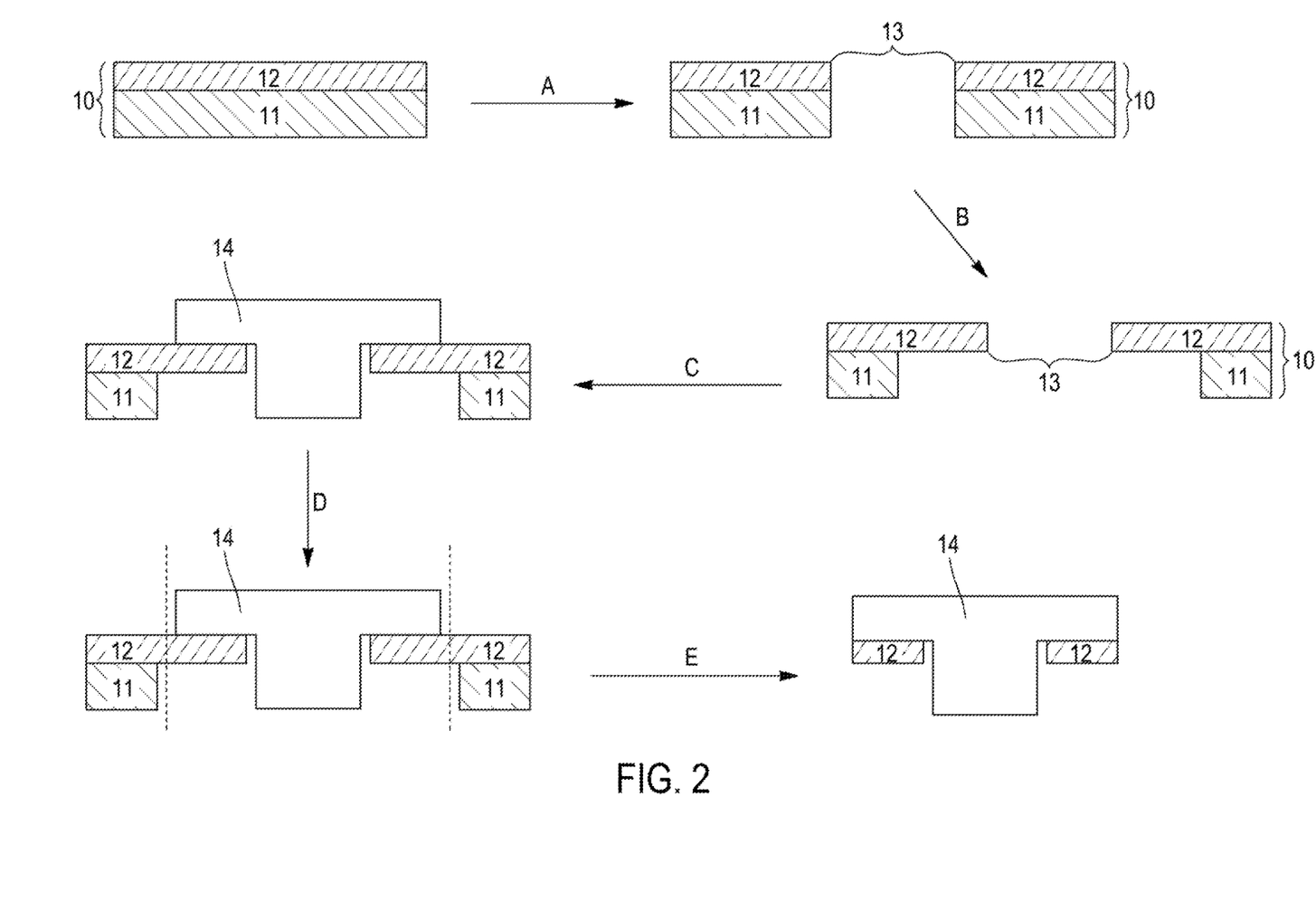
FIG. 2 schematically shows various steps of a second example of implementation of the process according to the invention.

According to a second example of implementation of the process according to the invention, the latter comprises the following steps (FIG. 2):

providing and unrolling a segment of a roll of a complex material forming a flexible carrier 10 comprising a flexible base strip 11 with two main faces, one of these main faces being at least partially covered with an adhesive film 12; alternatively, according to one variant, the base strip 11 is provided in a roll, then unrolled and laminated with an adhesive film 12, to form a flexible carrier 10 that is used, directly or not, in the following perforating step;

perforating A the flexible carrier 10 resulting from the preceding step so as to create apertures 13 through both the base strip 11 and regions of adhesive film 12;

«kiss cutting» B the base strip 11 and delaminating the latter in the vicinity of each aperture 13, to leave at least one region of adhesive film 12 without subjacent base strip 11, in the vicinity of each aperture 13;

placing C electronic components 14, each respectively in one aperture 13 produced in the perforating step A, and resting on the regions of adhesive film 12 that do not themselves rest on the base strip 11;

cutting D the adhesive film so as to essentially preserve regions of adhesive film 12 under the bonding regions 17 of the electronic components 14. This cutting D may be carried out practically concomitantly or just before a step E consisting in picking up (for example using a pick-and-place machine) the electronic components 14, with their adhesive film 12 placed in the bonding regions 17, with a view to integrating them, in a known way, into a cavity in a card body.

These steps may be essentially implemented with products and conditions that are essentially identical or similar to those described with reference to the first mode of implementation.

Figure 3:
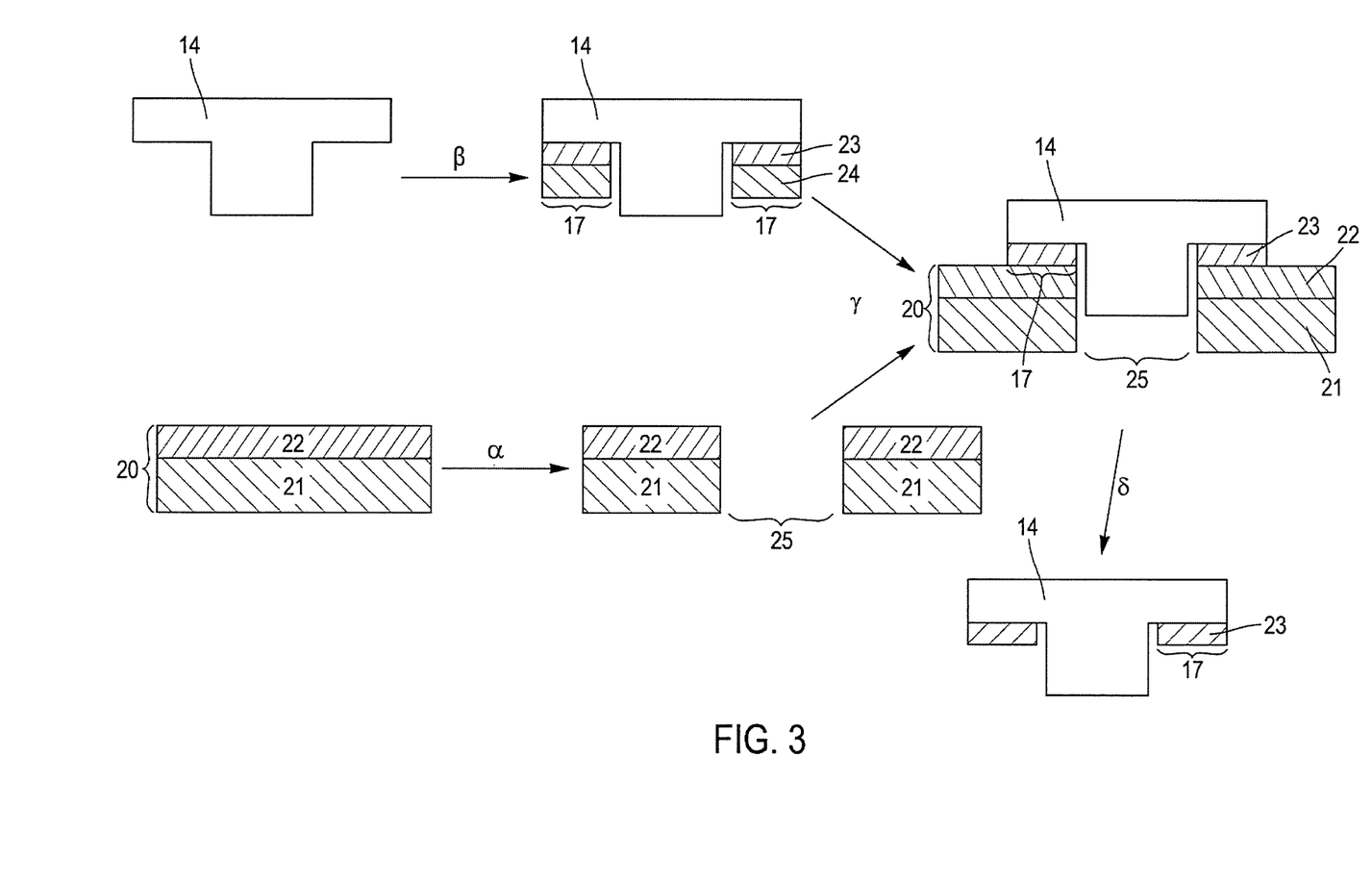
FIG. 3 schematically shows various steps of a third example of implementation of the process according to the invention.

According to a third example of implementation of the process according to the invention, said process comprises the following steps (FIG. 3):

unrolling a roll of flexible carrier 20 comprising a flexible base strip 21 with two main faces, one of these main faces being at least partially covered with a tacky adhesive 22; alternatively, according to one variant, the base strip 11 is provided in a roll, then unrolled and covered with a tacky adhesive 22, to form the flexible carrier 20 that is used directly, or not, in the following perforating step;

perforating a the flexible carrier 20 resulting from the preceding step, so as to create apertures 25 through both the base strip 21 and the layer of tacky adhesive 22;

preparing β electronic components 14 by placing a hot-melt material 23, which is optionally an anisotropic conductor, in bonding regions 17 of the components 14, with a protective film 24 protecting the hot-melt material on the face that does not make contact with the electronic component 14. For example, this preparation is carried out continuously by laminating the hot-melt material 23 in a strip, to a strip of flexible material comprising components 14, as may notably be the case if the electronic components 14 are continuously manufactured on said strips of flexible material;

placing γ electronic components 14, each respectively in one aperture 25 produced in the perforating step α, and making the regions of hot-melt material 23 rest on the layer of tacky adhesive 22, the protective film 24 having been peeled off beforehand, their region of extra thickness 18 being placed in an aperture 25.

Following this preparation and placement of the electronic components 14 on a roll of carrier for electronic components, which carrier is formed from the flexible carrier 20, the electronic components 14 may be picked up (for example by a pick-and-place machine—step δ) from the flexible carrier 20, with their adhesive film 23 placed in the bonding regions 17, with a view to being integrated, in a known way, into a cavity in a card body.

The flexible carrier 20 comprising the base strip 21 with its layer of tacky adhesive 22 is for example a polymer substrate with an adhesive layer having a set tack. The flexible carrier 20 for example corresponds to a product having the reference PET8030F from the company Dexerials (or to a similar product).

The electronic components 14 are placed, in step γ, on the flexible carrier 20, for example by a pick-and-place machine. The electronic components 14 are positioned on (and thus attached to) the flexible carrier 20 at room temperature.

As in the preceding examples of modes of implementation, the electronic components 14 may be modules according to ISO 7810 or feature modules such as devices for measuring biometrics, displays of card verification values, etc.

Figure 4:
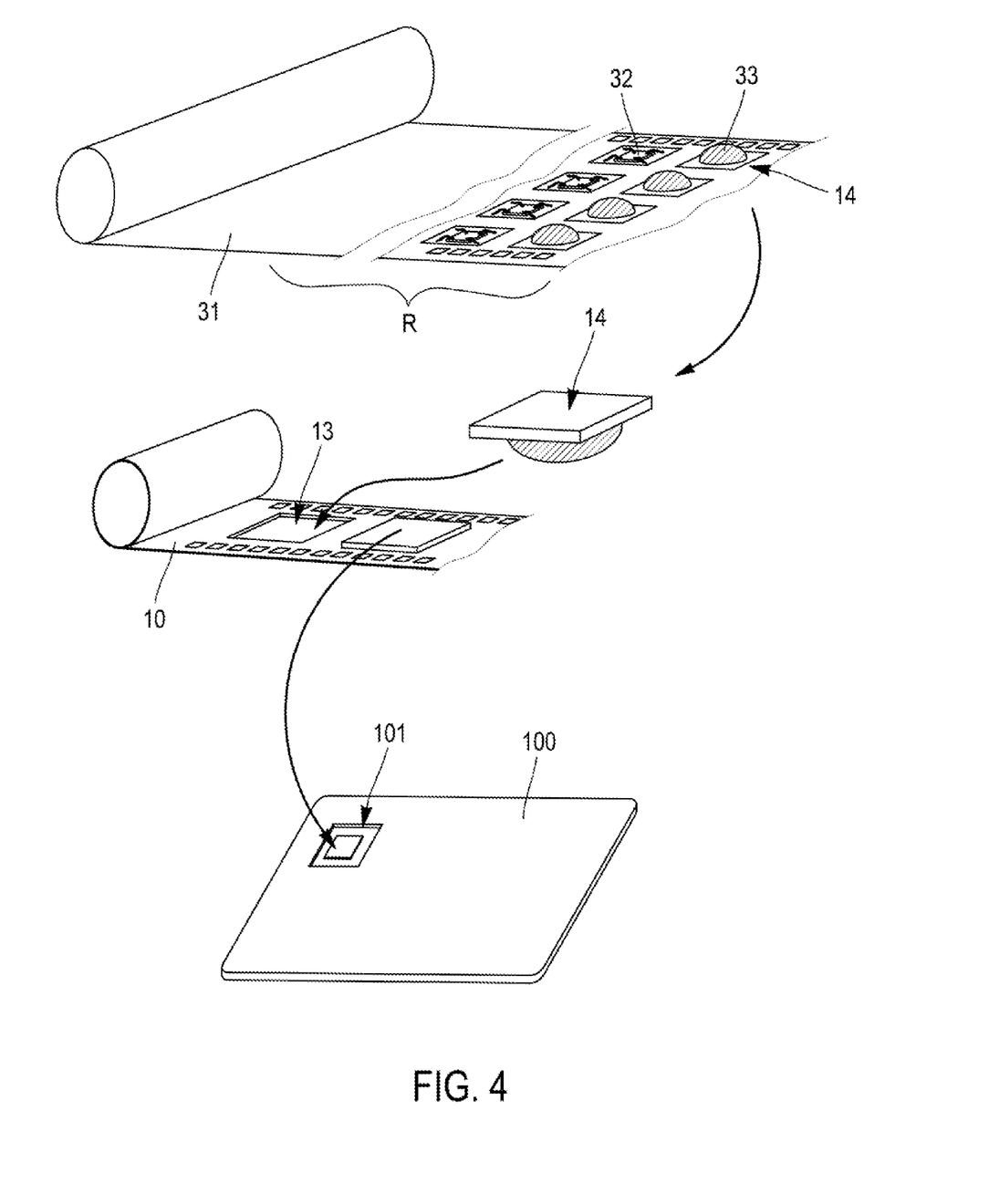
FIG. 4 schematically shows various steps of a fourth example of implementation of the process according to the invention.

According to a fourth example of a mode of implementation of the process according to the invention, the latter comprises the following steps (FIG. 4):

providing a flexible strip 31 of dielectric material, for example of 150 mm width; the material from which this flexible strip is made is for example glass-epoxy;

coating one of the main faces of the flexible strip 31 with an adhesive;

perforating the flexible strip 31 coated with adhesive;

laminating a sheet of electrically conductive material (for example of copper, aluminum, etc.) on the face of the flexible strip 31 coated with adhesive; alternatively, these four steps (providing the flexible strip, coating with adhesive, perforating, laminating the sheet of conductive material) are replaced by a step of providing a clad formed from a sheet of electrically conductive material borne by a strip of dielectric material;

carrying out a certain number of steps (perforating, optionally laminating a sheet of copper on another face, photolithography of patterns to form contacts on a first face and optionally other patterns on a second face, fastening an electronic chip to the second face, connecting the electronic chip 32 to contacts, encapsulating the electronic chip 32 and its interconnects in a glob-top 33) corresponding to continuous (roll-to-roll) manufacture of electronic components 14 (ISO modules in the present example);

cutting the electronic components 14 (for example held by suction on a holding arm) and their transfer (by the holding arm) to an adhesive flexible carrier 10 (for example a carrier comprising a hot-melt material or made of a hot-melt material), for example; this flexible carrier for example has a width of 35 mm for reasons of compatibility with machines and tools for inserting modules into a chip-card; if connection is necessary between the electronic components 14 and elements (antenna, flexible printed circuit, etc.) present in the card body 100, the adhesive flexible carrier 10 is furthermore conductive at least through its thickness; apertures 13 will have been produced (for example by «kiss cutting», as in step β described above) prior to the transfer of the electronic components 14 to the optionally conductive, adhesive flexible carrier 10, with a view to preserving at least one adhesive pad under each electronic component 14; and transferring the module to a cavity 101 cut in the body of a chip-card 100.

The invention claimed is:

1. A process for manufacturing a roll of flexible carrier for electronic components, comprising:
  a step of providing and unrolling a roll of flexible carrier,
  a step of providing at least one singulated electronic component having a top face and a bottom face and at least two different thicknesses (E, E') measured between the top face and the bottom face is provided, at least one bonding region being located, on the bottom face, level with the first (E) of these thicknesses, and at least one region of extra thickness being located, on the bottom face, level with the second (E') of these thicknesses, the second thickness (E') being larger than the first thickness (E),
  wherein
  the flexible carrier comprises an adhesive material suitable for receiving and fastening the singulated electronic component before this singulated electronic component is added to a chip-card,
  the process comprising:
    a step of producing a multiplicity of apertures with a regular arrangement in an unrolled portion of the flexible carrier,
    a step of placing each provided singulated electronic component on an unrolled portion of the flexible carrier, in an aperture, by placing the region of extra thickness in one of the apertures, so as to form in said at least one bonding region of each provided electronic component, at least one bonding pad inserted between the flexible carrier and each provided singulated electronic component.

2. The process as claimed in claim 1, wherein the bonding pad is made from said adhesive material.

3. The process as claimed in claim 1, comprising a step of adding at least one electronic component, with a segment of adhesive material on said bottom face, to the flexible carrier.

4. The process as claimed in claim 3, comprising a step of covering the flexible carrier with a layer of bonding material on a main face that receives at least one electronic component.

5. The process as claimed in claim 1, comprising a step of placing the adhesive material on a base strip to form the flexible carrier before the step of placing the bonding region of the electronic component above, directly in contact with the adhesive material.

6. The process as claimed in claim 1, wherein the flexible carrier comprises a base strip, and the process comprises:
  a step of cutting said base strip so as to leave exposed at least one region of adhesive material, under an electronic component,
  a step of cutting the adhesive material in said at least one region so as to detach the electronic component with a segment of adhesive material located in a bonding region.

7. The process as claimed in claim 1, comprising a step of laminating the adhesive material onto a base strip, before a step of producing apertures through the flexible carrier formed from the base strip and from the adhesive material.

8. The process as claimed in claim 1, wherein the adhesive material is a hot-melt film.

9. The process as claimed in claim 1, wherein the adhesive material is a conductive anisotropic film that is electrically conductive through a thickness of the adhesive material.

10. The process as claimed in claim 1, wherein the flexible carrier comprises paper.

11. A process as in claim 1, comprising
  a step of manufacturing said at least one electronic component on a flexible strip,
  a step of cutting out said at least one electronic component from said flexible strip so as to obtain said singulated electronic component before fastening the singulated electronic component onto said flexible carrier.

12. A process for manufacturing a chip-card module, comprising providing a roll of flexible carrier bearing electronic components, each electronic component, borne by this flexible carrier being a singulated electronic component having a top face and a bottom face and at least two different thicknesses (E, E') measured between the top face and the bottom face, at least one bonding region being located, on the bottom face, level with the first thickness (E) of these thicknesses, and at least one region of extra thickness being located, on the bottom face, level with the second thickness (E') of these thicknesses, the second thickness (E') being larger than the first thickness (E), each singulated electronic component having the region of extra thickness in an aperture produced in an unrolled portion of the flexible carrier, each singulated electronic component being equipped with a segment of adhesive material in a bonding region, and each singulated electronic component essentially forming a chip-card module.

13. A process for manufacturing a chip-card, comprising a step of providing a roll of flexible carrier bearing singulated electronic components, each singulated electronic component borne by this flexible carrier having a top face and a bottom face and at least two different thicknesses (E, E') measured between the top face and the bottom face, at least one bonding region being located, on the bottom face, level with the first thickness (E) of these thicknesses, and at least one region of extra thickness being located, on the bottom face, level with the second thickness (E') of these thicknesses, the second thickness (E') being larger than the first thickness (E), each singulated electronic component having the region of extra thickness in an aperture produced in an unrolled portion of the flexible carrier, each singulated electronic component being equipped with a segment of adhesive material in a bonding region, and each singulated electronic component essentially forming a chip-card module; and a step of picking up at least certain of the singulated electronic components borne by the flexible carrier and placing said at least certain of the singulated electronic components picked up from the flexible carrier in a cavity in a chip-card.

14. The process as claimed in claim 13, comprising a step of connecting each electronic component placed in a chip-card to a flexible printed circuit integrated into this chip-card.

15. A roll of flexible carrier bearing singulated electronic components, comprising:
a multiplicity of apertures cut, in a regular arrangement, through the thickness of the flexible carrier and
singulated electronic components having a top face and a bottom face, and at least two different thicknesses (E, E') measured between the top face and the bottom face, at least one bonding region being located, on the bottom face, level with the first (E) of these thicknesses (E, E'), and a region of extra thickness being located, on the bottom face, level with the second (E') of these thicknesses (E, E'), this second thickness (E') being larger than the first thickness (E), these singulated electronic components being placed, each respectively, in one aperture, by placing the region of extra thickness into an aperture, each singulated electronic component being placed on the flexible carrier with an adhesive material placed in a bonding region.

16. The carrier as claimed in claim 15, wherein the adhesive material is a hot-melt film.

17. The carrier as claimed in claim 15, wherein the adhesive material is a conductive anisotropic film that is electrically conductive through a thickness of the film.

18. A chip-card module manufactured with a process, comprising:
a step of providing and unrolling a roll of flexible carrier,
a step of providing at least one singulated electronic component having a top face and a bottom face and at least two different thicknesses (E, E') measured between the top face and the bottom face, at least one bonding region being located, on the bottom face, level with the first (E) of these thicknesses, and at least one region of extra thickness being located, on the bottom face, level with the second (E') of these thicknesses, the second thickness (E') being larger than the first thickness (E), wherein the flexible carrier comprises an adhesive material suitable for receiving and fastening the singulated electronic component before this singulated electronic component is added to a chip-card,
where an unrolled portion of the flexible carrier comprises a multiplicity of apertures with a regular arrangement in,
where each singulated electronic component is placed on an unrolled portion of the flexible carrier, in one of the apertures, by placing the region of extra thickness in the aperture, so as to form in said at least one bonding region of each provided electronic component, at least one bonding pad inserted between the flexible carrier and each provided singulated electronic component,
where the chip-card module comprises a segment of adhesive material in said bonding region.

19. A chip-card comprising at least one cavity in which a module as claimed in claim 18 is fastened, by virtue of the segment of adhesive material present in a bonding region.

* * * * *